(12) United States Patent
Gonzalez et al.

(10) Patent No.: US 6,927,358 B2
(45) Date of Patent: Aug. 9, 2005

(54) VACUUM SEAL PROTECTION IN A DIELECTRIC BREAK

(75) Inventors: Juan Jose Gonzalez, Fort Collins, CO (US); Steve Dillon, Fort Collins, CO (US); Andrew Shabalin, Fort Collins, CO (US); Fernando Gustavo Tomasel, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 144 days.

(21) Appl. No.: 10/356,188

(22) Filed: Jan. 31, 2003

(65) Prior Publication Data

US 2004/0149697 A1 Aug. 5, 2004

(51) Int. Cl.[7] .............................................. B23K 10/00
(52) U.S. Cl. ............................ 219/121.43; 219/121.48; 219/121.52; 219/121.36; 156/345.33; 204/298.37
(58) Field of Search ........................ 219/121.36, 121.52, 219/121.48, 121.4, 121.43; 315/111.51; 156/345.35, 345.38, 345.48, 345.49, 345.33; 118/723 R, 723 I, 723 IR, 723 AN; 204/298.37

(56) References Cited

U.S. PATENT DOCUMENTS

| 5,560,166 A | * 10/1996 | Burke et al. ................... 52/218 |
| 5,690,795 A | * 11/1997 | Rosenstein et al. ...... 204/192.1 |
| 5,998,933 A | 12/1999 | Shun'ko |
| 6,150,628 A | 11/2000 | Smith et al. |
| 6,388,226 B1 | 5/2002 | Smith et al. |
| 6,392,351 B1 | 5/2002 | Shun'ko |
| 6,432,260 B1 | 8/2002 | Mahoney et al. |

FOREIGN PATENT DOCUMENTS

EP  1 087 157 A2 *  3/2001

* cited by examiner

*Primary Examiner*—Mark Paschall
(74) *Attorney, Agent, or Firm*—Gordon Lindeen

(57) ABSTRACT

In one aspect of the invention is a method to create a vacuum seal with extended lifetime to form a dielectric break in a vacuum chamber. The method includes the use of an elastic dielectric seal to form a high vacuum seal. It also includes the use of different means to protect the vacuum seal from direct exposure to the plasma and to reactive gases present inside the plasma chamber. Furthermore, it includes the use of elements to ensure a proper compression of the elastic seal, and to avoid its expansion or contraction when the pressures on both sides of the seal are different.

17 Claims, 2 Drawing Sheets

VACUUM SEAL PROTECTION IN A DIELECTRIC BREAK

BACKGROUND OF THE INVENTION

1. Field

Embodiments of this invention relate to the field of plasma chambers, and more specifically, to create an extended lifetime vacuum seal to form a dielectric break in a plasma chamber.

2. Description of Related Art

Inductively coupled plasmas (ICP) are routinely used in a number of different applications including materials processing, production of activated gases, pollutant abatement and many others. In such devices, a coil is placed in close proximity to, around or within a vacuum chamber. When the coil is excited with radio frequency (RF), the electromagnetic fields induced around the coil create and sustain a gas plasma discharge within the vacuum apparatus. The plasma is coupled to the coil either through the air or through a magnetic core. In the latter case, the sources are called transformer coupled plasma (TCP) sources.

The vacuum chamber is often a metal vessel that includes at least one dielectric gap to avoid the creation of a closed current loop through the chamber. To maintain the vacuum integrity of the chamber, the dielectric section must seal against the metal sections of the chamber forming a high vacuum seal. The vacuum seal is made of an elastic dielectric material, such as an elastomer.

To seal properly, the vacuum seal needs to be compressed so its thickness lies within a certain range specified by the manufacturer. At the same time, the vacuum seal needs to be protected from direct exposure to the plasma. Being elastic, the vacuum seal needs a means to prevent its expansion or contraction when the pressures on both sides of the seal are different. Also, to extend the lifetime of the seal, it is convenient to reduce the exposure of the vacuum seal to the reactive species present inside the plasma chamber. Therefore, a mounting scheme allowing the creation of an extended lifetime vacuum seal to form a dielectric break in a plasma chamber is desired.

SUMMARY OF THE INVENTION

In one aspect of the invention is an extended lifetime vacuum seal. The extended lifetime vacuum seal includes an elastic material that forms a high vacuum seal. It also includes a gap through which harmful elements may enter an area that uses the elastic material, at least one protective shield to protect the elastic material from the harmful elements, and a spacer to set the compression for the elastic material.

BRIEF DESCRIPTION OF THE DRAWINGS

Embodiments of the present invention are illustrated by way of example, and not by way of limitation, in the figures of the accompanying drawings and in which like reference numerals refer to similar elements and in which.

DETAILED DESCRIPTION OF THE INVENTION

1. Overview

In one aspect of the invention is an extended lifetime vacuum seal to form a dielectric break in a plasma chamber. General embodiments of the invention comprise a gap formed by sections of the plasma chamber; a protective shield at the gap formed by a first housing portion and a second housing portion, the protective shield to guard the vacuum seal from direct exposure to the plasma; a vacuum seal adjacent to the protective shield to form a closure between the housing portions; and a spacer adjacent to the vacuum seal to set the compression for vacuum seal. In exemplary embodiments, the vacuum seal is additionally concentrically aligned with the protective shield, and the spacer is additionally concentrically aligned with the vacuum seal.

In one embodiment, the protective shield exposed to the plasma can transfer heat to the housing before it gets transferred to the adjacent vacuum seal. In another embodiment, the dielectric break additionally comprises a secondary shield that is adjacent to the protective shield on one side, and the vacuum seal on the opposite side. In exemplary embodiments, the secondary shield is concentrically aligned with the protective shield and the vacuum seal.

2. General Discussion

Figure 1:
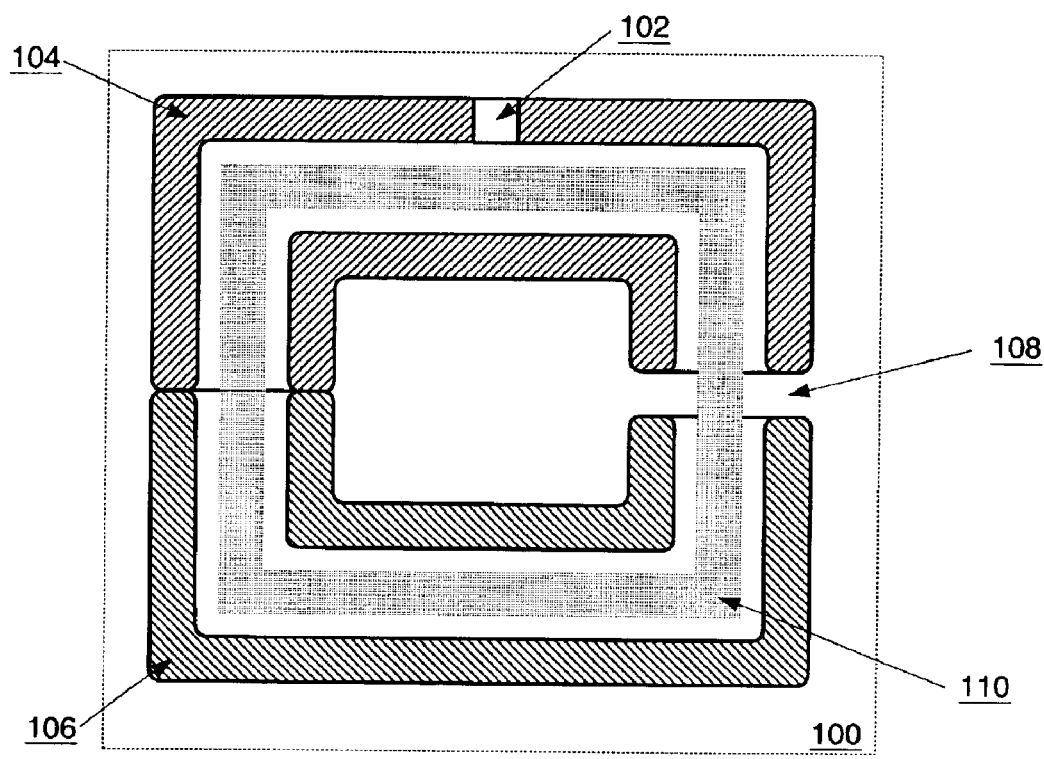
FIG. 1 illustrates a plasma chamber in accordance with general embodiments of the invention.

FIG. 1 illustrates a plasma chamber 100 in accordance with general embodiments of the invention. The plasma chamber 100 is formed from a first housing portion 104, and a second housing portion 106, and comprises at least one dielectric break 108 (only one shown) between the first and second housing portions 104, 106 to prevent induced current flow from forming in the plasma chamber 100. The housing portions 104, 106 may comprise a metal such as aluminum, copper, nickel, or steel, or a coated metal such as anodized aluminum or nickel-plated aluminum.

In steady state operation, the working gas is continuously injected into the gas inlet 102, and interacts with the inductively coupled plasma 110 created within the chamber. As a result, many different molecular, atomic and ionized species can be created. These plasma-created species can then be used for various applications, including chamber cleaning, etching, and deposition.

Part of the energy inductively coupled to the plasma is deposited into the wall in the form of radiation, ion bombardment and exothermic surface reactions, among others. The metal portions of the chamber, when properly coated and cooled, can be made very resistant to plasma-induced damage. However, the elastic dielectric materials used for the vacuum seals are usually very poor heat conductors, so heat dissipation is very inefficient. Also, they can be susceptible to both direct ion bombardment and attack by reactive species created in the plasma.

Figure 2:
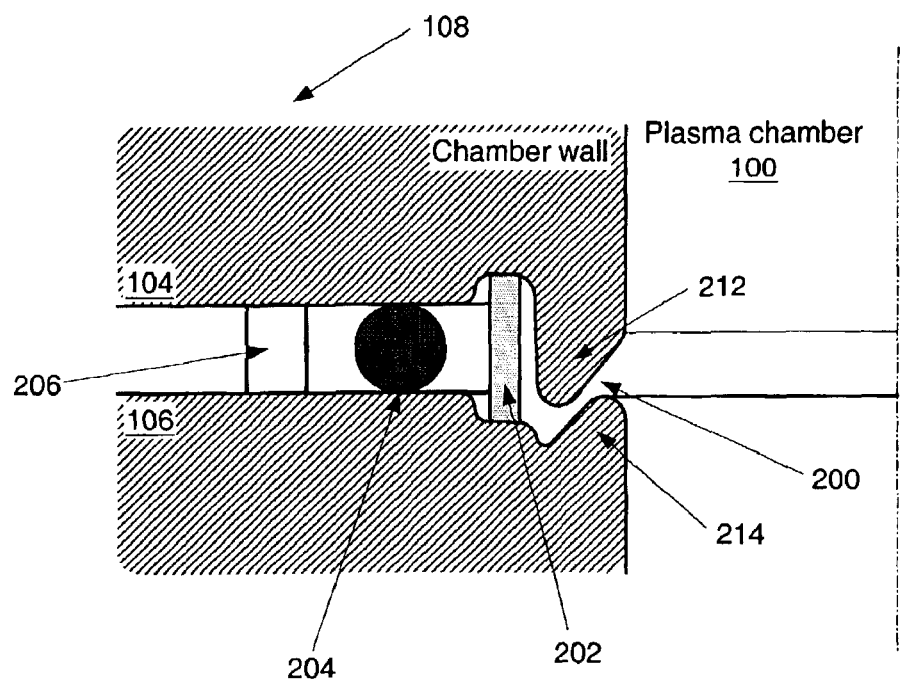
FIG. 2 illustrates a dielectric break of a plasma chamber in a first embodiment of the invention.
Figure 3:
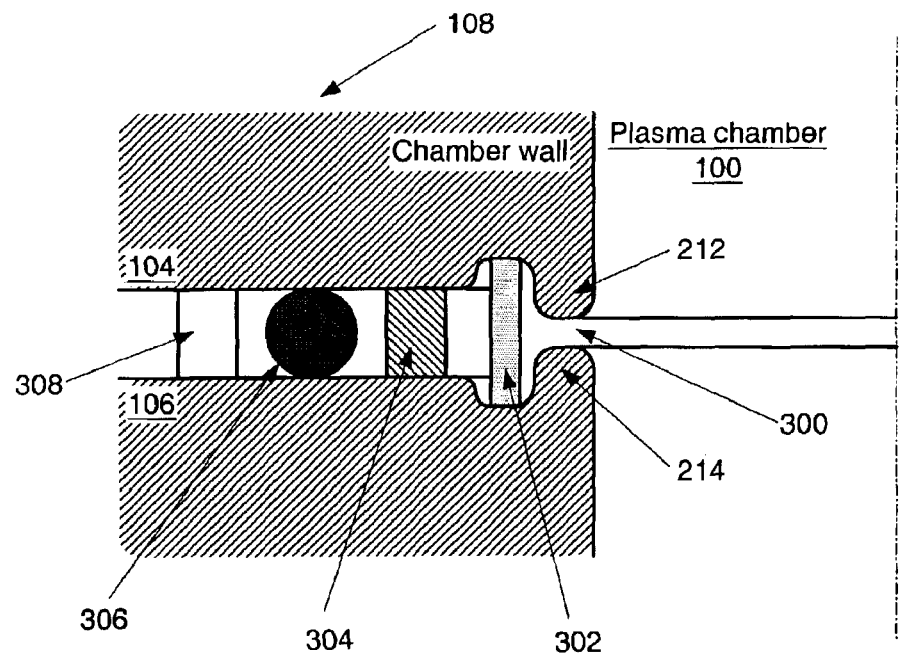
FIG. 3 illustrates a dielectric break of a plasma chamber in a second embodiment of the invention.

FIG. 2 illustrates a dielectric break 108 of a plasma chamber 100 in a first embodiment of the invention. A dielectric break 108 comprises a gap 200, a protective shield 202, a vacuum seal 204, and a spacer 206, which are all located between the first 104 and second housing portions 106 of the plasma chamber 100. This is referred to as the single-shield embodiment. FIG. 3 illustrates a dielectric break 108 of a plasma chamber 100 in a second embodiment of the invention. A dielectric break 108 in the second embodiment comprises a gap 300, a protective shield 302, a secondary shield 304, a vacuum seal 306, and a spacer 308, which are all located between the first 104 and second housing portions 106 of the plasma chamber 100. This is referred to as the double-shield embodiment.

Each component is discussed in more detail below, with specific references made to each embodiment where appropriate.

Gaps 200, 300 are formed from the protrusion 212, 214 of the housing portions 104, 106 when the housing portions 104, 106 are mated. In both embodiments, the gaps 200, 300 formed by the protrusions increase the probability of collision of ions from the plasma 110 in the plasma chamber 100 against the walls of the gap before reaching the protective shield 202, 302. FIGS. 2 and 3 show two typical examples of angles between the gaps 200, 300 and the chamber walls, although the invention should not be limited to this.

The protective shield 202, 302 is used to protect the vacuum seal 204, 306 from direct contact with the plasma 110. The protective shield 202, 302 is located between the first housing 104 and the second housing 106 at the gap 200, 300 of the dielectric break 108. The protective shield 202, 302 may be made of a dielectric material with good thermal characteristics and resistance to ion bombardment and chemical attack, such as a ceramic.

The secondary shield 304 is used in the double-shield embodiment to protect the vacuum seal 306 from the hot protective shield 302, and to provide enhanced protection against chemical attack by reactive species. It is also beneficial in the case of internally coated vacuum chambers, as explained below. Furthermore, it prevents the vacuum seal 306 from collapsing when the pressure inside the chamber is lower than the pressure outside the chamber. The secondary shield can be made of a chemically resistant dielectric material, such as Teflon.

In the single-shield embodiment, the vacuum seal 204 is adjacent to the high thermal resistant shield 202, and in the double-shield embodiment, the vacuum seal 306 is adjacent to the secondary shield 304. In both embodiments, the vacuum seal provides a closure between the first housing 104 and the second housing 106 when they are mated. The vacuum seal 204 is typically in contact with a smooth area of the bare metal of the chamber to ensure a high quality vacuum seal.

In internally coated vacuum chambers, the location of the vacuum seal is a delicate issue from the point of view of mechanical assembly. In these vacuum chambers, the vacuum seal sits on the uncoated side of the boundary between the coated and uncoated portions of the chamber in order to minimize the exposure of the bare metal to reactive gases while ensuring a high quality vacuum seal. The use of a secondary shield simplifies the assembly of the chamber since the transition from the coating to the bare metal can be accommodated within the width of the secondary shield. In this case, the secondary shield also protects the uncoated portion of the chamber close to the vacuum seal from chemical attack.

The presence of particles in the plasma chamber may be a serious concern in some areas of plasma processing. A further advantage of the double-shielded embodiment is that it offers a high resistance to particles that may be generated by the eventual degradation of the surface of the vacuum seal, and that escape into the chamber.

The spacer 206, 308 ensures that the compression of the vacuum seal is within the specifications from the manufacturer. The spacer may be made of a dielectric material with low fragility, structurally apt to withstand the compression needed to ensure the closure of the chamber. A polymer with high compression resistance and negligible cold flow over time such as Ultem is an example of such a material.

3. General Matters

In the description above, for the purposes of explanation, numerous specific details are set forth in order to provide a thorough understanding of the present invention. It will be apparent, however, to one skilled in the art that the present invention may be practiced without some of these specific details. In other instances, well-known circuits, structures, devices, and techniques have been shown in block diagram form or without detail in order not to obscure the understanding of this description.

The present invention includes various steps, but steps can be added to or deleted from any of the methods and signal or messages can be added or subtracted from any of the described steps or control lines without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

Furthermore, while the invention has been illustrated in the context of a plasma chamber, the invention is not so limited. It can be applied to a great variety of fields where harmful elements, such as ion bombardment, chemical or thermal reactions, may degrade or corrode an elastic material such as a vacuum seal.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

What is claimed is:

1. An apparatus comprising:
   a gap through which corrosive elements enter an area that uses an elastic dielectric seal to seal the area;
   a protective dielectric shield located at the gap to protect the elastic dielectric seal from corrosive elements that enter the area through the gap;
   the elastic dielectric seal adjacent to the protective dielectric shield; and
   a spacer adjacent to the elastic dielectric seal, the spacer to set a compression for the elastic seal.

2. An apparatus comprising:
   a gap through which corrosive elements enter an area using an elastic dielectric seal to seal the area;
   a protective dielectric shield located at the gap to protect the elastic dielectric seal from corrosive elements that enter the area through the gap;
   a secondary dielectric shield adjacent to the protective dielectric shield;
   the elastic seal adjacent to the secondary dielectric shield; and
   a spacer adjacent to the elastic dielectric seal, the spacer to set a compression for the elastic seal.

3. A dielectric break in a plasma chamber in which plasma is present, comprising:
- a gap formed between a first housing portion and a second housing portion of the plasma chamber;
- a protective dielectric shield located between the first housing and the second housing at the gap;
- a dielectric vacuum seal located between the first housing and second housing, and adjacent to the protective shield, the vacuum seal to create a closure between the first housing and the second housing when they are mated; and
- a spacer located between the first housing and the second housing, and adjacent to the vacuum seal, the spacer to set a compression for the vacuum seal.

4. The dielectric break of claim 3, wherein the gap is formed by a protrusion of the first housing and a protrusion of the second housing when the first housing is mated to the second housing.

5. The dielectric break of claim 3, wherein the vacuum seal is additionally concentrically aligned with the protective shield, and the spacer is additionally concentrically aligned with the vacuum seal.

6. The dielectric break of claim 3, wherein the protective shield is used to protect the vacuum seal from direct contact with the plasma.

7. A dielectric break, comprising:
- a gap formed between a first housing portion and a second housing portion of the plasma chamber;
- a protective dielectric shield located between the first housing and the second housing at the gap;
- a secondary dielectric shield located between the first housing and the second housing, and adjacent to the protective shield;
- a dielectric vacuum seal located between the first housing and second housing, and adjacent to the secondary shield, the vacuum seal to create a closure between the first housing and the second housing when they are mated; and
- a spacer located between the first housing and the second housing, and adjacent to the vacuum seal, the spacer to set a compression for the vacuum seal.

8. The dielectric break of claim 6, wherein the gap is formed by a protrusion of the first housing and a protrusion of the second housing when the first housing is mated to the second housing.

9. The dielectric break of claim 6, wherein the vacuum seal is additionally concentrically aligned with the protective shield, and the spacer is additionally concentrically aligned with the vacuum seal.

10. The dielectric break of claim 6, wherein the protective shield is used to protect the vacuum seal from direct contact with the plasma.

11. The dielectric break of claim 6, wherein the secondary shield is used to protect the vacuum seal from heat generated from the protective shield.

12. A plasma chamber, comprising:
- a first housing portion;
- a second housing portion mated to the first housing portion; and
- at least one dielectric break between the first housing portion and the second housing portion, each dielectric break having:
  - a gap formed between a first housing portion and a second housing portion of the plasma chamber;
  - a protective shield located between the first housing and the second housing at the gap;
  - a vacuum seal located between the first housing and second housing, the vacuum seal to create a closure between the first housing and the second housing when they are mated; and
  - a spacer located between the first housing and the second housing, the spacer to set a compression for the vacuum seal.

13. The plasma chamber of claim 12, wherein the inlet gap is formed by a protrusion of the first housing and a protrusion of the second housing when the first housing is mated to the second housing.

14. The plasma chamber of claim 12, wherein the vacuum seal is adjacent to and concentrically aligned with the protective shield, and the spacer is adjacent to and concentrically aligned with the vacuum seal.

15. The plasma chamber of claim 12, additionally comprising a secondary shield that is adjacent to the protective shield on one side, and adjacent to the vacuum seal on the opposite side, and the secondary shield is used to protect the vacuum seal from heat generated from the protective shield.

16. The plasma chamber of claim 15, wherein the vacuum seal is adjacent to and concentrically aligned with the secondary shield, the spacer is adjacent to and concentrically aligned with the vacuum seal, and the secondary shield is additionally concentrically aligned with the protective shield.

17. The plasma chamber of claim 12, wherein the protective shield is used to protect the vacuum seal from direct contact with the plasma.

* * * * *